(12) United States Patent
Seo et al.

(10) Patent No.: US 12,016,196 B2
(45) Date of Patent: Jun. 18, 2024

(54) DISPLAY APPARATUS

(71) Applicant: SAMSUNG DISPLAY CO., LTD., Yongin-si (KR)

(72) Inventors: Junghan Seo, Yongin-si (KR); Wooyong Sung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/698,090

(22) Filed: Mar. 18, 2022

(65) Prior Publication Data

US 2022/0209190 A1 Jun. 30, 2022

Related U.S. Application Data

(63) Continuation of application No. 16/390,129, filed on Apr. 22, 2019, now Pat. No. 11,309,517.

(30) Foreign Application Priority Data

Aug. 24, 2018 (KR) .......................... 10-2018-0099429

(51) Int. Cl.
*H10K 50/844* (2023.01)
*H10K 59/00* (2023.01)
(Continued)

(52) U.S. Cl.
CPC .......... *H10K 50/844* (2023.02); *H10K 59/00* (2023.02); *H10K 59/12* (2023.02); *H10K 77/10* (2023.02)

(58) Field of Classification Search
CPC ............ H01L 51/5253; H01L 27/3225; H01L 27/3244; H01L 51/0096; H01L 51/5256; (Continued)

(56) References Cited

U.S. PATENT DOCUMENTS 9,054,060 B2   6/2015   Kang et al.
9,825,103 B2   11/2017  Rappoport et al.
(Continued)

FOREIGN PATENT DOCUMENTS

CN   106887523   6/2017
CN   107275363   10/2017
(Continued)

OTHER PUBLICATIONS

Notice of Allowance issued in corresponding KR Patent Application No. 10-2018-0099429 dated Aug. 11, 2023.
(Continued)

*Primary Examiner* — Nilufa Rahim
(74) *Attorney, Agent, or Firm* — F. Chau & Associates, LLC (57) ABSTRACT

A display apparatus includes: a substrate including a display area and a peripheral area outside the display area; an inorganic insulating layer stacked on the substrate and located in the display area and the peripheral area; an organic insulating layer on the inorganic insulating layer; a through portion located in the display area and penetrating through the substrate, the inorganic insulating layer, and the organic insulating layer; and at least one groove surrounding the through portion, wherein an end portion of the inorganic insulating layer is covered by the organic insulating layer at an outer side of the at least one groove, and the end portion faces the through portion.

20 Claims, 8 Drawing Sheets

(51) Int. Cl.
*H10K 59/12* (2023.01)
*H10K 77/10* (2023.01)

(58) Field of Classification Search
CPC . H01L 51/5237; H01L 27/1214; H01L 51/56; Y02E 10/549; Y02P 70/50; G09F 9/33
See application file for complete search history.

(56) References Cited

U.S. PATENT DOCUMENTS

| | | |
|---|---|---|
| 9,905,629 B2 | 2/2018 | Kim et al. |
| 10,199,448 B2 | 2/2019 | Kim et al. |
| 10,205,122 B2 | 2/2019 | Choi et al. |
| 10,897,026 B2 | 1/2021 | Abe |
| 2014/0061618 A1 | 3/2014 | Kang et al. |
| 2017/0026553 A1 | 1/2017 | Lee et al. |
| 2017/0148856 A1 | 5/2017 | Choi et al. |
| 2017/0162111 A1 | 6/2017 | Kang et al. |
| 2017/0194411 A1 | 7/2017 | Park et al. |
| 2017/0237038 A1 | 8/2017 | Kim et al. |
| 2017/0288004 A1 | 10/2017 | Kim et al. |
| 2018/0226617 A1* | 8/2018 | Nakagawa ............. H01L 51/56 |
| 2018/0351126 A1 | 12/2018 | Choi |
| 2019/0326553 A1 | 10/2019 | Abe |
| 2019/0363284 A1* | 11/2019 | Yasuda ............. H10K 50/8426 |
| 2020/0067017 A1 | 2/2020 | Seo et al. |

FOREIGN PATENT DOCUMENTS

| | | |
|---|---|---|
| CN | 107546245 | 1/2018 |
| CN | 111033782 | 4/2020 |
| JP | 2010-014475 | 1/2010 |
| KR | 10-2012-0019973 | 3/2012 |
| KR | 10-2013-0137455 | 12/2013 |
| KR | 10-2014-0031002 | 3/2014 |
| KR | 10-2017-0059864 | 5/2017 |
| KR | 10-2017-0063326 | 6/2017 |
| KR | 10-2017-0065059 | 6/2017 |
| KR | 10-2017-0096646 | 8/2017 |
| KR | 10-2017-0115177 | 10/2017 |

OTHER PUBLICATIONS

Office Action issued in corresponding CN Patent Application No. 201910776857.5 on Dec. 18, 2023.

* cited by examiner

DISPLAY APPARATUS

CROSS-REFERENCE TO RELATED APPLICATIONS

This application is a continuation of U.S. patent application Ser. No. 16/390,129 filed on Apr. 22, 2019, which claims priority under 35 U.S.C. § 119 to Korean Patent Application No. 10-2018-0099429, filed on Aug. 24, 2018, in the Korean Intellectual Property Office, the disclosures of which are incorporated by reference herein in their entireties.

1. TECHNICAL FIELD

The present inventive concept relates to a display apparatus.

2. DESCRIPTION OF THE RELATED ART

Display apparatuses may be devoid of physical buttons on a front surface to increase a display area for displaying images. An additional member such as a camera may be arranged in a display area of a display apparatus. To locate an additional member such as a camera in the display area, a groove or a through portion in which the additional member may be located is provided in the display area. However, the groove or the through portion may act as a moisture permeation path through which external moisture may pass into the display area.

SUMMARY

According to an exemplary embodiment of the present inventive concept, a display apparatus includes: a substrate including a display area and a peripheral area outside the display area; an inorganic insulating layer stacked on the substrate and located in the display area and the peripheral area; an organic insulating layer on the inorganic insulating layer; a through portion located in the display area and penetrating through the substrate, the inorganic insulating layer, and the organic insulating layer; and at least one groove surrounding the through portion, wherein an end portion of the inorganic insulating layer is covered by the organic insulating layer at an outer side of the at least one groove, and the end portion faces the through portion.

The at least one groove may include a first groove surrounding the through portion and a second groove spaced apart from the first groove and surrounding the first groove, a first region is located between the display area and the second groove, a second region is located between the first groove and the second groove, and a third region is located between the first groove and the through portion, and in the first region, the end portion of the inorganic insulating layer may be covered by the organic insulating layer.

The display apparatus may include a thin-film transistor located on the substrate in the display area and comprising a semiconductor layer, a gate electrode, a source electrode, and a drain electrode, wherein the inorganic insulating layer may include at least one of a first inorganic insulating layer located between the semiconductor layer and the gate electrode and a second inorganic insulating layer located between the gate electrode and the source and drain electrodes.

The display apparatus may further include a thin-film transistor and a display device, wherein the thin-film transistor is located on the substrate in the display area, and the display device is electrically connected to the thin-film transistor, wherein the organic insulating layer may include at least one of a first organic insulating layer and a second organic insulating layer, wherein the first organic insulating layer covers the thin-film transistor, and the second organic insulating layer is on the first organic insulating layer.

In the first region, the end portion of the inorganic insulating layer protruding away from the first organic insulating layer may be covered by the second organic insulating layer.

The display device may include an intermediate layer, a pixel electrode, end an opposite electrode, and the second organic insulating layer may expose at least a portion of the pixel electrode.

The inorganic insulating layer may be located in the first region and the third region, and may not be located in the second region.

A blocking portion including a material that is the same as a material included in the organic insulating layer may be located in the second region.

The substrate may further include a first base layer, a first barrier layer, a second base layer, and a second barrier layer that are sequentially stacked, the first groove and the second groove may each extend from the second barrier layer to a portion of the second base layer, and the second barrier layer may include a pair of first tips and a pair of second tips, the pair of first tips facing each other and extending towards each other at an open upper portion of the first groove, and the pair of second tips facing each other and extending towards each other at an open upper portion of the second groove.

The display apparatus may further include an encapsulation layer located on the organic insulating layer, wherein the encapsulation layer may include a first inorganic encapsulation layer, a second inorganic encapsulation layer, and an organic encapsulation layer between the first inorganic encapsulation layer and the second inorganic encapsulation layer, the organic encapsulation layer may fill the second groove, and the first inorganic encapsulation layer and the second inorganic encapsulation layer may contact each other in the first groove.

According to an exemplary embodiment of the present inventive concept, a display apparatus includes: a substrate including a display area and a peripheral area outside the display area; a thin-film transistor and a display device, the thin-film transistor being located on the substrate in the display area, and the display device being electrically connected to the thin-film transistor; at least one through portion located in the display area and vertically penetrating through the substrate and a plurality of layers stacked on the substrate; and at least one groove surrounding the at least one through portion, wherein the thin-film transistor includes a semiconductor layer, a gate electrode, a source electrode, and a drain electrode, the plurality of layers include a first inorganic insulating layer between the semiconductor layer and the gate electrode, a second inorganic insulating layer between the gate electrode and the source and drain electrodes, and an organic insulating layer on the thin-film transistor, and end portions of the first inorganic insulating layer and the second inorganic insulating layer are covered by the organic insulating layer, the end portions facing the at least one through portion at an outer side of the at least one groove.

The at least one groove may include a first groove and a second groove that are spaced apart from each other, a first region is located between the display area and the second groove, a second region is located between the first groove and the second groove, and a third region is located between the first groove and the at least one through portion, and in the first region, an end portion of the organic insulating layer may be closer to the second groove than the end portions of the first inorganic insulating layer and the second inorganic insulating layer facing the at least one through portion.

The substrate may include a first base layer, a first barrier layer, a second base layer, and a second barrier layer that are sequentially stacked, the first groove and the second groove may each extend from the second barrier layer to a portion of the second base layer, and a width of an open upper portion of the first groove may be less than a width of an inner portion of the first groove, and a width of an open upper portion of the second groove may be less than a width of an inner portion of the second groove.

The second barrier layer may include a pair of first tips and a pair of second tips, the pair of first tips having cantilever shapes facing each other at the open upper portion of the first groove, and the pair of second tips having cantilever shapes facing each other at the open upper portion of the second groove.

The display apparatus may further include an encapsulation layer on the organic insulating layer, the encapsulation layer including a first inorganic encapsulation layer, a second inorganic encapsulation layer, and an organic encapsulation layer between the first inorganic encapsulation layer and the second inorganic encapsulation layer, wherein the organic encapsulation layer may fill the second groove, and the first inorganic encapsulation layer and the second inorganic encapsulation layer may contact each other in the first groove.

The display device may include an intermediate layer, a pixel electrode, and an opposite electrode, and the organic insulating layer may include a first organic insulating layer and a second organic insulating layer, the first organic insulating layer covering the thin-film transistor, and the second organic insulating layer located on the first organic insulating layer and exposing at least a portion of the pixel electrode.

In the first region, the end portions of the first inorganic insulating layer and the second inorganic insulating layer may be covered by the first organic insulating layer.

In the first region, the end portions of the first inorganic insulating layer and the second inorganic insulating layer may protrude away from the first organic insulating layer, and the end portions of the first inorganic insulating layer and the second inorganic insulating layer protruding away from the first organic insulating layer may be covered by the second organic insulating layer.

A blocking portion may be located in the second region, and the blocking portion may include at least one of a first layer and a second layer, wherein the first layer may include a material that is the same as a material of the first organic insulating layer, and the second layer includes a material that is the same as a material of the second organic insulating layer.

The first inorganic insulating layer, the second inorganic insulating layer, and the organic insulating layer may be located in the first region and the third region, and are not located in the second region.

BRIEF DESCRIPTION OF THE DRAWINGS

The above and other features of the present inventive concept will become more apparent by describing in detail exemplary embodiments thereof, with reference to the accompanying drawings in which.

DETAILED DESCRIPTION OF THE EMBODIMENTS

Exemplary embodiments of the present inventive concept will now be described with reference to the accompanying drawings. This inventive concept may, however, be embodied in many different forms and should not be construed as being limited to the embodiments set forth herein.

An expression used in the singular encompasses the expression of the plural, unless it has a clearly different meaning in the context.

It will be understood that when a layer, region, or component is referred to as being "formed on" another layer, region, or component, it may be directly formed on the other layer, region, or component, or intervening layers, regions, or components may be present.

Sizes of components in the drawings may be exaggerated for convenience of explanation. In addition, like reference numerals may refer to like elements throughout the specification.

Figure 1:
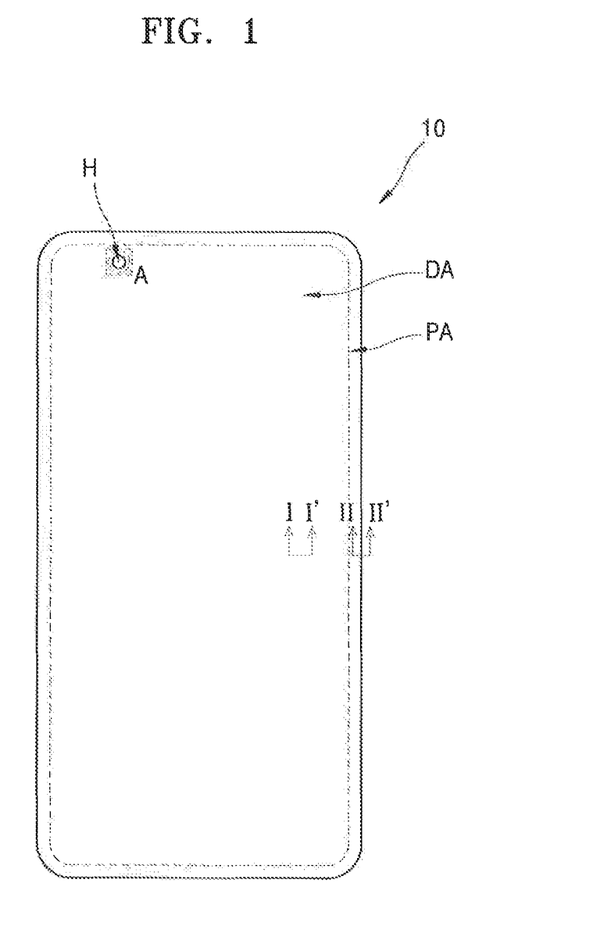
FIG. 1 is a plan view of a display apparatus according to an exemplary embodiment of the present inventive concept.
Figure 2:
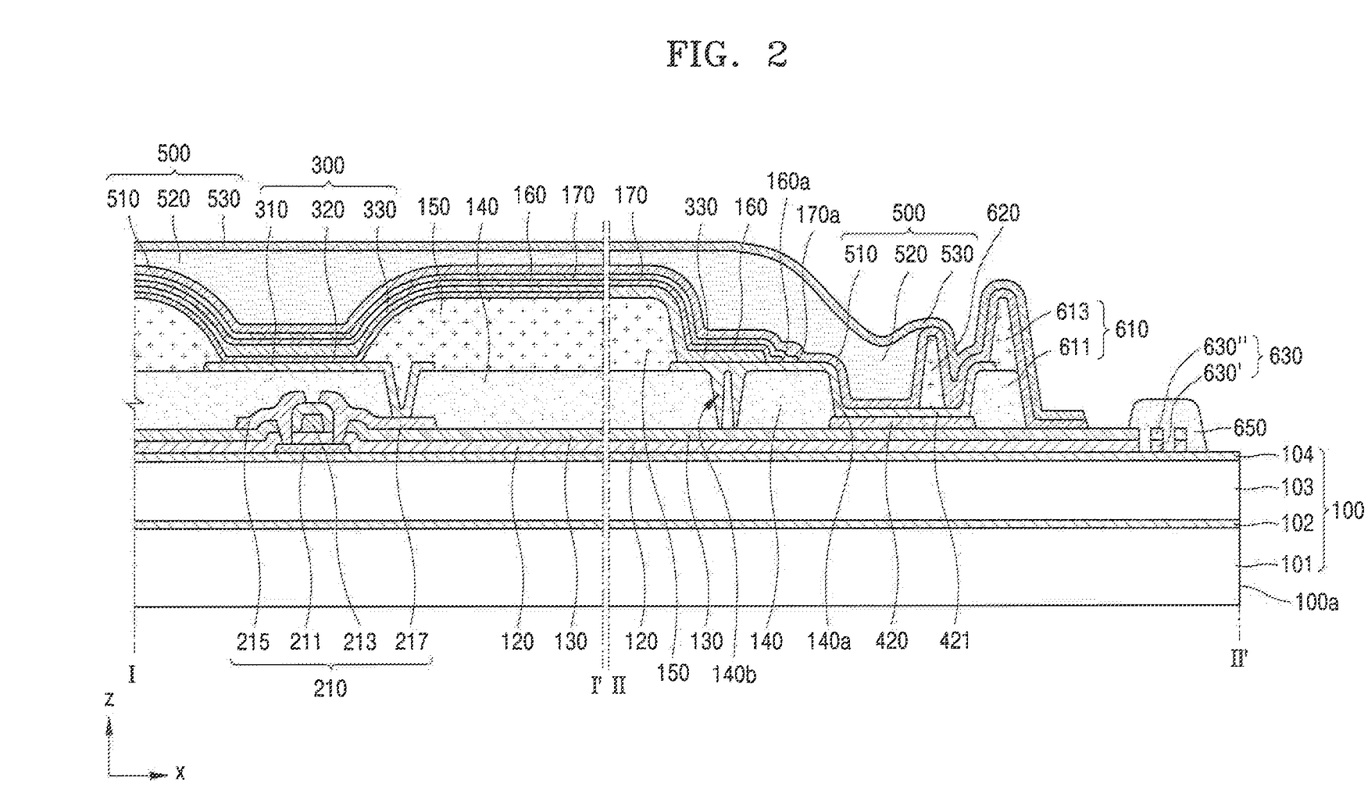
FIG. 2 is a cross-sectional view taken along line I-I' and line II-II' in FIG. 1, according to an exemplary embodiment of the present inventive concept.

FIG. 1 is a plan view of a display apparatus 10 according to an exemplary embodiment of the present inventive concept, and FIG. 2 is a cross-sectional view taken along line I-I' and II-II' of FIG. 1, according to an exemplary embodiment of the present inventive concept.

Referring to FIG. 1 and FIG. 2, the display apparatus 10 according to the present embodiment includes a display area DA for displaying images, and a peripheral area PA located on an outer portion of the display area DA. A substrate 100 includes the display area DA and the peripheral area PA.

A display device is located in the display area DA, and the peripheral area PA may include a pad area to which various electronic devices, a printed circuit board, etc. are electrically attached.

A thin film transistor 210 electrically connected to the display device may be located in the display area DA. FIG. 2 shows that an organic light-emitting device 300 is located in the display area DA as the display device. That the organic light-emitting device 300 is electrically connected to the thin film transistor 210 may denote that a pixel electrode 310 of the organic light-emitting device 300 is electrically connected to the thin film transistor 210.

At least one through portion H may be located in the display area DA. The through portion H may be a space for an additional member. The additional member may be used to execute a function of the display apparatus 10 or add new functionality to the display apparatus 10. For example, a plurality of through portions H may be provided in the display area DA, and additional members such as a sensor, a light source, a camera module, etc, may be located in the through portions H.

Since the through portion H is a region penetrating through the substrate 100 and a plurality of layers are stacked on the substrate 100 in a vertical direction, external moisture or oxygen may pass into the display apparatus 10 through an exposed vertical cross-section of the display apparatus 10 in the through portion H. However, according to the present embodiment, at least one groove surrounding the through portion H is provided, and thus, the permeation of moisture may be prevented. The through portion H will be described in detail with reference to FIG. 3 and so on, and a configuration of the display apparatus 10 will be described below with reference to FIG. 2.

The substrate 100 may include various materials. When the display apparatus 10 is a bottom emission type, in which an image is displayed through the substrate 100, the substrate 100 includes a transparent material. However, in a case where the display apparatus 10 is a top emission type, in which an image is displayed in a direction opposite the substrate 100, the substrate 100 may not have a transparent material. In this case, the substrate 100 may include metal. When the substrate 100 includes the metal, the substrate 100 may include iron, chrome, manganese, nickel, titanium, molybdenum, stainless steel (SUS), an Invar alloy, an Inconel alloy, or a Kovar alloy.

As an example, the substrate 100 may include a multi-layered structure in which a first base layer 101, a first barrier layer 102, a second base layer 103, and a second barrier layer 104 are sequentially stacked.

The first base layer 101 and the second base layer 103 may include, for example, a transparent glass material including $SiO_2$ as a main component. However, the first base layer 101 and the second base layer 103 are not limited thereto, in other words, they may include a transparent plastic material. The plastic material may include a polyether sulfone (PES), polyacrylate (PAR), polyetherimide (PEI), polyethylene naphthalate (PEN), polyethylene terephthalate (PET), polyphynylene sulfide (PPS), polyarylate, polyimide (PI), polycarbonate (PC), cellulose triacetate (TAC), cellulose acetate propionate (CAP), etc.

Thicknesses of the first base layer 101 and the second base layer 103 may be the same as or different from each other. For example, each of the first base layer 101 and the second base layer 103 may include polyimide and may have a thickness of about 3 μm to about 20 μm.

The first barrier layer 102 and the second barrier layer 104 prevent an external foreign substance from infiltrating into the display apparatus 10 through the substrate 100, and may have a single-layered or multi-layered structure including an inorganic material such as silicon nitride (SiNx) and/or silicon oxide (SiOx). For example, the first barrier layer 102 may have a multi-layered structure including an amorphous silicon layer for increasing an adhesive force between neighboring layers and a silicon oxide layer, and the second barrier layer 104 may include a silicon oxide layer. In addition, each of the first barrier layer 102 and the second barrier layer 104 may have a thickness of about 4000 Å to about 7000 Å, but is not limited thereto.

A buffer layer may be further arranged on the substrate 100. The buffer layer may provide a flat surface on an upper portion of the substrate 100 and may block impurities or moisture infiltrating through the substrate 100. For example, the buffer layer may include an inorganic material such as silicon oxide, silicon nitride, silicon oxynitride, aluminum oxide, aluminum nitride, titanium oxide, titanium nitride, etc. or an organic material such as polyimide, polyester, acryl, etc., and may have a stack structure including a plurality of materials selected from the above-stated materials. In some embodiments of the present inventive concept, the second barrier layer 104 of the substrate 100 may be a part of the buffer layer having the multi-layered structure.

The thin film transistor 210 is arranged in the display area DA of the substrate 100, and a display device electrically connected to the thin film transistor 210 is also arranged in the display area DA. FIG. 2 shows the organic light-emitting device 300 as the display device. A thin film transistor may be also arranged in the peripheral area PA of the substrate 100. The thin film transistor located in the peripheral area PA may be, for example, a part of a circuit for controlling an electrical signal applied to the display area DA.

The thin film transistor 210 includes a semiconductor layer 211 including amorphous silicon, polycrystalline silicon, or an organic semiconductor material, a gate electrode 213, a source electrode 215, and a drain electrode 217. In addition, when the buffer layer is arranged on the substrate 100, the semiconductor layer 211 may be located on the buffer layer.

The gate electrode 213 is arranged on the semiconductor layer 211, and the source electrode 215 and the drain electrode 217 are electrically connected to each other according to a signal applied to the gate electrode 213. The gate electrode 213 may include, for example, one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), and may have a single-layered or multi-layered structure. Here, to ensure an insulating property between the semiconductor layer 211 and the gate electrode 213, a first inorganic insulating layer 120 including an inorganic material such as silicon oxide, silicon nitride, silicon oxynitride, etc. may be interposed between the semiconductor layer 211 and the gate electrode 213.

A second inorganic insulating layer 130 may be arranged on the gate electrode 213, and the second inorganic insulating layer 130 may include a single-layered or multi-layered structure including an inorganic material such as silicon oxide, silicon nitride, silicon oxynitride, etc.

The source electrode 215 and the drain electrode 217 are arranged on the second inorganic insulating layer 130. The source electrode 215 and the drain electrode 217 are electrically connected to the semiconductor layer 211 via contact holes formed in the second inorganic insulating layer 130 and the first inorganic insulating layer 120. The source electrode 215 and the drain electrode 217 may include one or more of, for example, Al, Pt, Pd, Ag, Mg, Au, Ni, Nd, Ir, Cr, Li, Ca, Mo, Ti, W, and Cu, taking into account a conductive property, and may have a single-layered or multi-layered structure.

A protective layer for covering the thin film transistor 210 may be arranged to protect the thin film transistor 210 having the above structure. The protective layer may include, for example, an inorganic material such as silicon oxide, silicon nitride, silicon oxynitride, etc. The protective layer may have a single-layered or multi-layered structure.

A first organic insulating layer 140 may be arranged on the thin film transistor 210. For example, as shown in FIG. 2, when the organic light-emitting device 300 is arranged at a location higher than the thin film transistor 210, the first organic insulating layer 140 covers the thin film transistor 210 to planarize a curve formed by the thin film transistor 210. The first organic insulating layer 140 may include, for example, an organic insulating material such as acryl, benzocyclobutene (BCB), hexamethyldisilioxane (HMDSO), etc. In FIG. 2, the first organic insulating layer 140 has a single-layered structure, but the first organic insulating layer 140 may have a multi-layered structure. The display apparatus 10 according to the present embodiment may include both the protective layer and the first organic insulating layer 140, or may only include the first organic insulating layer 140.

In the display area DA of the substrate 100, the organic light-emitting device 300 includes the pixel electrode 310, an opposite electrode 330, and an intermediate layer 320 having an emission layer between the pixel electrode 310 and the opposite electrode 330. The organic light-emitting device 300 is arranged on the first organic insulating layer 140.

The first organic insulating layer 140 includes an opening for exposing at least one of the source electrode 215 and the drain electrode 217 of the thin film transistor 210. The pixel electrode 310 that is electrically connected to the thin film transistor 210 by contacting one of the source electrode 215 and the drain electrode 217 through the opening is arranged on the first organic insulating layer 140.

The pixel electrode 310 may be a semi-transparent electrode or a reflective electrode. When the pixel electrode 310 is a semi-transparent electrode, the pixel electrode 310 may include, for example, ITO, IZO, $In_2O_3$, IGO, or AZO. When the pixel electrode 310 is a reflective electrode, the pixel electrode 310 may include a reflective layer including Ag, Mg, Al, Pt, Pd, Au, Ni, Nd, Ir, Cr, a compound thereof, etc. and a layer including ITO, IZO, IGO, or AZO. However, exemplary embodiments of the present inventive concept are not limited thereto. For example, the pixel electrode 310 may include various materials and may have various structures, e.g., a single-layered or multi-layered structure.

A second organic insulating layer 150 may be arranged on the first organic insulating layer 140. The second organic insulating layer 150 includes an opening corresponding to each sub-pixel, in other words, an opening exposing at least a center of the pixel electrode 310, to define pixels. In addition, in the example as shown in FIG. 2, the second organic insulating layer 150 increases a distance between an edge of the pixel electrode 310 and the opposite electrode 330 above the pixel electrode 310 to prevent generation of an arc at the edge of the pixel electrode 310. The second organic insulating layer 150 may include, for example, an organic insulating material such as polyimide, HMDSO, etc.

The intermediate layer 320 of the organic light-emitting device 300 includes an emission layer. The emission layer may include a polymer or low-molecular weight organic material emitting a predetermined color light. In addition, the intermediate layer 320 may include at least one functional layer from among a hole transport layer (HTL), a hole injection layer (HIL), an electron transport layer (ETL), and an electron injection layer (EIL). The functional layer may include an organic material. In addition, some of a plurality of layers included in the intermediate layer 320, e.g., the functional layer(s), may be integrally provided throughout a plurality of organic light-emitting devices 300.

The opposite electrode 330 may cover the display area DA. The opposite electrode 330 is integrally provided throughout the plurality of organic light-emitting devices 300 to correspond to a plurality of pixel electrodes 310. The opposite electrode 330 may be a semi-transparent electrode or a reflective electrode. When the opposite electrode 330 is the semi-transparent electrode, the opposite electrode 330 may include a layer including metal of a small work function, in other words, Li, Ca, LiF/Ca, LiF/Al, Al, Ag, Mg, and a compound thereof, and a semi-transparent conductive layer including ITO, IZO, ZnO, $In_2O_3$, etc. When the opposite electrode 330 is a reflective electrode, the opposite electrode 330 may include a layer including Li, Ca, LiF/Ca, LiF/Al, Al, Ag, Mg, and a compound thereof. A structure and a material included in the opposite electrode 330 are not limited to the above examples, as various modifications are possible.

In order for the display apparatus 10 to display an image, an electrical signal set in advance is applied to the opposite electrode 330. To do this, a voltage line 420 is located in the peripheral area PA to transfer the electrical signal set in advance to the opposite electrode 330. The voltage line 420 may be a common power voltage (ELVSS) line.

The voltage line 420 may be formed by using the same material as those of various conductive layers in the display area DA. In addition, the voltage line 420 may be formed simultaneously with the conductive layers. In FIG. 2, like the source electrode 215 and the drain electrode 217 of the thin film transistor 210 located on the second inorganic insulating layer 130 in the display area DA, the voltage line 420 is located on the second inorganic insulating layer 130 in the peripheral area PA. In this case, when the source electrode 215 and the drain electrode 217 of the thin film transistor 210 in the display area DA are arranged on the second inorganic insulating layer 130, the voltage line 420 is also arranged on the second inorganic insulating layer 130 in the peripheral area PA by using the same material as that of the source and drain electrodes 215 and 217. Accordingly, the voltage line 420 may have a structure that is the same as those of the source electrode 215 and the drain electrode 217. However, exemplary embodiments of the present inventive concept are not limited thereto. For example, the voltage line 420 may be simultaneously arranged on the first inorganic insulating layer 120 with the gate electrode 213 by using the same material as that of the gate electrode 213.

The opposite electrode 330 may directly contact the voltage line 420, or may be electrically connected to the voltage line 420 via a conductive protecting layer 421 as shown in FIG. 2. The conductive protecting layer 421 is located on the first organic insulating layer 140 and extends over the voltage line 420 to be electrically connected to the voltage line 420. Accordingly, the opposite electrode 330 contacts the conductive protecting layer 421 in the peripheral area PA, and the conductive protecting layer 421 may also contact the voltage line 420 in the peripheral area PA.

Since the conductive protecting layer 421 is located on the first organic insulating layer 140 as shown in FIG. 2, the conductive protecting layer 421 may be arranged simultaneously with a component on the first organic insulating layer 140 in the display area DA by using the same material as that of the component. For example, when the pixel electrode 310 is arranged on the first organic insulating layer 140 in the display area DA, the conductive protecting layer 421 may be arranged on the first organic insulating layer 140 in the peripheral area PA, at the same time, by using the same material as that of the pixel electrode 310. Accordingly, the conductive protecting layer 421 may have the same structure as the pixel electrode 310. The conductive protecting layer 421 may cover a part of the voltage line 420, which is exposed without being covered by the first organic insulating layer 140, as shown in FIG. 2. As such, damage to the voltage line 420 exposed to outside of the first organic insulating layer 140 may be prevented during a process of arranging a first restriction dam 610 or a second restriction dam 620.

In addition, to prevent impurities such as external oxygen or moisture from infiltrating into the display area DA through the first organic insulating layer 140, the first organic insulating layer 140 may have an opening 140b in the peripheral area PA as shown in FIG. 2. The opening 140b may surround the display area DA. In addition, when the conductive protecting layer 421 is arranged, the opening 140b may be filled with the conductive protecting layer 421. As such, impurities infiltrating into the first organic insulating layer 140 of the peripheral area PA may be prevented from infiltrating into the first organic insulating layer 140 in the display area DA.

A capping layer 160 for increasing efficiency of light emitted from the organic light-emitting device 300 is located on the opposite electrode 330. The capping layer 160 covers the opposite electrode 330, and extends to an outer portion of the opposite electrode 330 to contact the conductive protecting layer 421 located under the opposite electrode 330. The opposite electrode 330 covers the display area DA and extends to the outer portion of the display area DA, and thus, the capping layer 160 also covers the display area DA and extends to the peripheral area PA on the outer portion of the display area DA. The capping layer 160 includes an organic material.

As described above, the capping layer 160 increases the efficiency of light emitted from the organic light-emitting device 300. For example, a light extraction efficiency to outside may be improved. The efficiency improvement due to the capping layer 160 may exist uniformly throughout the display area DA. In addition, the capping layer 160 may have an upper surface corresponding to a curve of an upper surface of a lower layer thereof. In other words, as shown in FIG. 2, when the capping layer 160 is located on the opposite electrode 330, the upper surface of the capping layer 160 may have a shape corresponding to a curve of an upper surface of the opposite electrode 330.

An encapsulation layer 500 is located on the capping layer 160. The encapsulation layer 500 protects the organic light-emitting device 300 against external moisture or oxygen. To do this, the encapsulation layer 500 extends to the peripheral area PA on the outer portion of the display area DA, as well as covers the display area DA in which the organic light-emitting device 300 is located. The encapsulation layer 500 may have a multi-layered structure. For example, as shown in FIG. 2, the encapsulation layer 500 may include a first inorganic encapsulation layer 510, an organic encapsulation layer 520, and a second inorganic encapsulation layer 530.

The first inorganic encapsulation layer 510 covers the capping layer 160, and may include silicon oxide, silicon nitride, and/or silicon oxynitride. Since the first inorganic encapsulation layer 510 is arranged along a lower structure of encapsulating layer 500, as shown in FIG. 2, the first inorganic encapsulation layer 510 may have an upper surface that is not flat. The organic encapsulation layer 520 covers the first inorganic encapsulation layer 510 and has a sufficiently large thickness so that an upper surface of the organic encapsulation layer 520 may be substantially flat throughout the entire display area DA. The organic encapsulation layer 520 may include one or more of polyethylene terephthalate, polyethylene naphthalate, polycarbonate, polyimide, polyethylene sulfonate, polyoxymethylene, polyarylate, and hexamethyl disiloxane. The second inorganic encapsulation layer 530 covers the organic encapsulation layer 520, and may include silicon oxide, silicon nitride, and/or silicon oxynitride. The second inorganic encapsulation layer 530 extends to an outer portion of the organic encapsulation layer 520 to contact the first inorganic encapsulation layer 510, and thus, the organic encapsulation layer 520 is not exposed to the outside.

As described above, since the encapsulation layer 500 includes the first inorganic encapsulation layer 510, the organic encapsulation layer 520, and the second inorganic encapsulation layer 530, even when cracks occur in the encapsulation layer 500, the cracks may be disconnected between the first inorganic encapsulation layer 510 and the organic encapsulation layer 520 or between the organic encapsulation layer 520 and the second inorganic encapsulation layer 530. As such, generation of an infiltration path through which external moisture or oxygen passes to the display area DA may be prevented or reduced.

While arranging the encapsulation layer 500, structures beneath the encapsulation layer 500 may break. For example, the first inorganic encapsulation layer 510 may be generated by a chemical vapor deposition method, and when the first inorganic encapsulation layer 510 is generated by the chemical vapor deposition method, a layer right under the first inorganic encapsulation layer 510 may be damaged. Therefore, when the first inorganic encapsulation layer 510 is directly arranged on the capping layer 160, the capping layer 160, which can increase the efficiency of the light emitted from the organic light-emitting device 300, may be damaged and the light efficiency of the display apparatus 10 may degrade. Therefore, to prevent damage to the capping layer 160 while arranging the encapsulation layer 500, a protective layer 170 may be provided between the capping layer 160 and the encapsulation layer 500. The protective layer 170 may include LiF.

As described above, the capping layer 160 extends to the peripheral area PA on the outer portion of the display area DA, as well as covers the display area DA. Accordingly, the protective layer 170 extends to the outer portion of the capping layer 160 so as not to allow the capping layer 160 and the encapsulation layer 500 to directly contact each other. In this case, the protective layer 170 covers an end 160a of the capping layer 160, and thus, an end 170a of the protective layer 170 is located on the first organic insulating layer 140. For example, as shown in FIG. 2, the end 170a of the protective layer 170 directly contacts the conductive protecting layer 421 on the first organic insulating layer 140.

Therefore, a lowermost layer in the encapsulation layer 500, in other words, the first inorganic encapsulation layer 510, does not contact the capping layer 160 including the organic material. Instead, the first inorganic encapsulation layer 510 contacts the protective layer 170 including an inorganic material such as LiF, and thus, an adhesive force between the encapsulation layer 500 and the layers beneath the encapsulation layer 500 may be maintained. As such, isolation of the encapsulation layer 500 from the layers therebelow may be prevented or reduced during manufacture of the display apparatus 10 or when using the display apparatus 10 after its manufacture.

In addition, when the encapsulation layer 500 is arranged, in particular, the organic encapsulation layer 520 is arranged, a material for forming the organic encapsulation layer 520 is located within a preset region. To do this, as shown in FIG. 2, the first restriction dam 610 may be located in the peripheral area PA. For example, the first organic insulating layer 140, as well as the first inorganic insulating layer 120 and the second inorganic insulating layer 130, may be located in the peripheral area PA and in the display area DA of the substrate 100 as shown in FIG. 2. The first restriction dam 610 is located in the peripheral area PA and spaced apart from the first organic insulating layer 140.

The first restriction dam 610 may have a multi-layered structure. In other words, the first restriction dam 610 may include a first layer 611 and a second layer 613 in a direction away from the substrate 100. The first layer 611 may be arranged simultaneously with the first organic insulating layer 140 in the display area DA by using the same material as the first organic insulating layer 140. The second layer 613 may be arranged simultaneously with the second organic insulating layer 150 in the display area DA by using the same material as that of the second organic insulating layer 150.

As shown in FIG. 2, in addition to the first restriction dam 610, the second restriction dam 620 may be provided between the first restriction dam 610 and an end 140a of the first organic insulating layer 140. The second restriction dam 620 may be located on the conductive protecting layer 421 on the voltage line 420. The second restriction dam 620 is also located in the peripheral area PA and spaced apart from the first organic insulating layer 140. The second restriction dam 620 may also have a multi-layered structure like the first restriction dam 610, but may have fewer layers than the first restriction dam 610. In this case, the second restriction dam 620 may have a height that is less than that of the first restriction dam 610 from the substrate 100. FIG. 2 shows that the second restriction dam 620 is arranged simultaneously with the second layer 613 in the first restriction dam 610 by using the same material as that of the second layer 613.

Therefore, a location of the organic encapsulation layer 520 is limited by the second restriction dam 620, and overflow of the material for forming the organic encapsulation layer 520 beyond the second restriction dam 620 may be prevented. Even when the material for forming the organic encapsulation layer 520 partially overflows beyond the second restriction dam 620, the material for forming the organic encapsulation layer 520 may not move further to an edge 100a of the substrate 100 due to the first restriction dam 610. Unlike the organic insulating layer 520, the first inorganic encapsulation layer 510 and the second inorganic encapsulation layer 530 generated by the chemical vapor deposition method are arranged to extend beyond the first restriction dam 610 and cover both the second restriction dam 620 and the first restriction dam 610 as shown in FIG. 2.

In addition, as shown in FIG. 2, a crack prevention dam 630 is located in the peripheral area PA. The crack prevention dam 630 may extend along at least a part of the edge 100a of the substrate 100. For example, the crack prevention dam 630 may have a shape circling the display area DA. In some sections, the crack prevention dam 630 may have a discontinuous shape. The crack prevention dam 630 may prevent cracks from being transferred to the display area DA, when the cracks occur in the first inorganic insulating layer 120 and the second inorganic insulating layer 130 due to impact when cutting a mother substrate during manufacture of the display apparatus 10 or when the display apparatus 10 is used.

The crack prevention dam 630 may have various shapes, and as shown in FIG. 2, the crack prevention dam 630 may be simultaneously arranged with some components in the display area DA by using the same material and may have a multi-layered structure. In FIG. 2, the crack prevention dam 630 has a multi-layered structure including a lower layer 630' and an upper layer 630" on the lower layer 630'. For example, in FIG. 2, the crack prevention dam 630 includes the lower layer 630' including the same material as that of the first inorganic insulating layer 120 and the upper layer 630" including the same material as that of the second inorganic insulating layer 130. When the buffer layer is located on the substrate 100, the crack prevention dam 630 may include a layer including the same material as that of the buffer layer. In addition, as shown in FIG. 2, there may be a plurality of crack prevention dams 630 spaced apart from one another.

The crack prevention dam 630 may be generated by partially removing the first inorganic insulating layer 120 and the second inorganic insulating layer 130. In other words, as shown in FIG. 2, a groove formed by removing the first inorganic insulating layer 120 and the second inorganic insulating layer 130 is generated on at least a side of the crack prevention dam 630. The crack prevention dam 630 may consist of remaining parts of the first inorganic insulating layer 120 and the second inorganic insulating layer 130 adjacent to the groove.

The crack prevention dam 630 is covered by a cover layer 650 as shown in FIG. 2. The cover layer 650 may be arranged simultaneously with the forming of the first organic insulating layer 140 in the display area DA by using the same material as that of the first organic insulating layer 140. In other words, the cover layer 650 may include an organic material for covering the crack prevention dam 630 including the inorganic material. The cover layer 650 may cover ends of the first inorganic insulating layer 120 and/or the second inorganic insulating layer 130 in a direction towards the edge 100a of the substrate 100, and may also cover the crack prevention dam 630.

Figure 3:
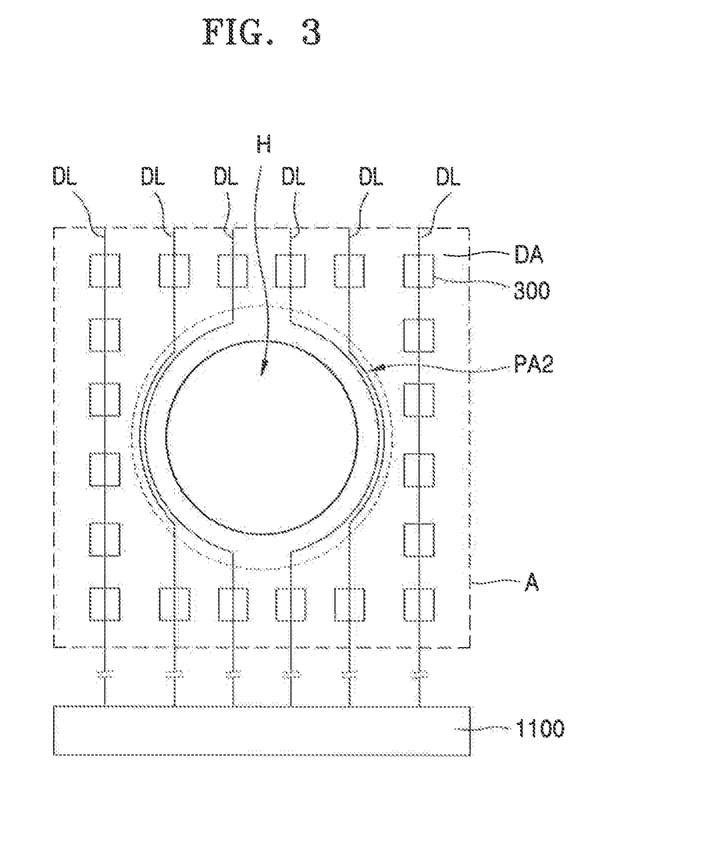
FIG. 3 is a plan view showing an enlarged view of portion A in FIG. 1, according to an exemplary embodiment of the present inventive concept.
Figure 4:
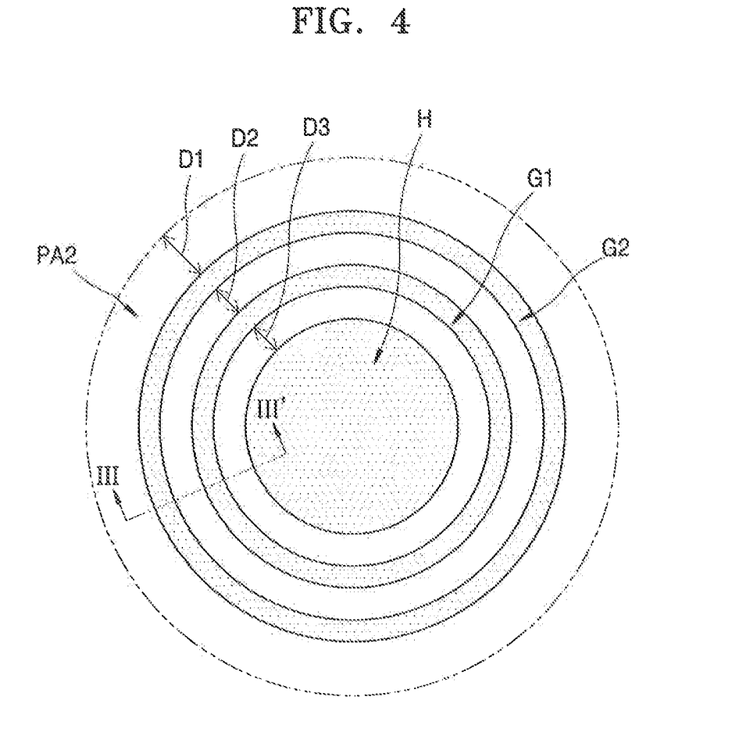
FIG. 4 is a plan view of a through portion of FIG. 3, according to an exemplary embodiment of the present inventive concept.
Figure 5:
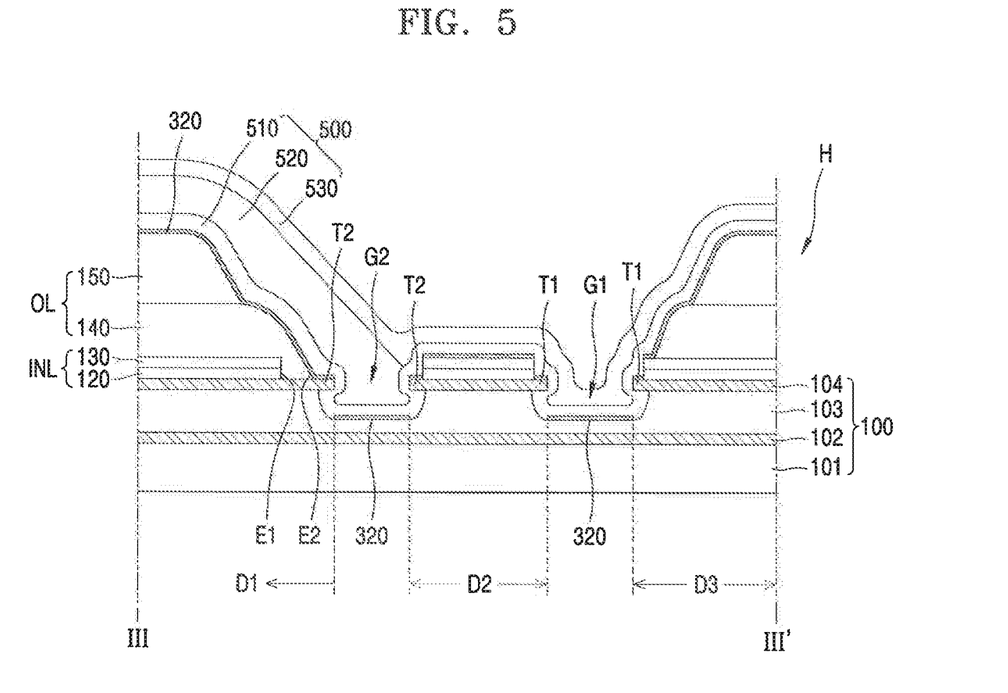
FIG. 5 is a cross-sectional view taken along line III-III' of FIG. 4, according to an exemplary embodiment of the present inventive concept.

FIG. 3 is a plan view showing an enlarged view of a part A in FIG. 1, according to an exemplary embodiment of the present inventive concept, FIG. 4 is a plan view showing an example of the through portion in FIG. 3, according to an exemplary embodiment of the present inventive concept, and FIG. 5 is a cross-sectional view showing an example taken along line III-III' of FIG. 4, according to an exemplary embodiment of the present inventive concept.

FIG. 3 shows the through portion H and a periphery of the through portion H. Referring to FIG. 3, a plurality of organic light-emitting devices 300 connected to a plurality of data lines DL are arranged in the display area DA around the through portion H, and a space between the through portion H and the display area DA may be referred to as a non-display area PA2 on which an image is not displayed.

The data lines DL extend in a first direction to be electrically connected to a data driver 1100. As an example, the data driver 1100 of a chip on panel (COP) type may be arranged in the peripheral area PA (see FIG. 1) or may be arranged on a flexible printed circuit board that is electrically connected to a terminal included in the peripheral area PA (see FIG. 1).

In addition, some of the data lines DL extending in the first direction may not be formed straight along the first direction due to the through portion H arranged in the display area DA. In this case, those data lines DL are configured to detour around the through portion H, and the data lines DL detouring around the through portion H are located in the non-display area PA2 around the through portion H.

In addition, scan lines may extend along a second direction that intersects with the first direction so that the scan lines intersect with the data lines DL, and some of the scan lines may be configured to detour around the through portion H in the region where the through portion H is formed. As another example, the display apparatus 10 (see FIG. 1) includes two scan drivers arranged at opposite sides of the display area DA so that the scan lines may not detour around the through portion H. In other words, a scan line electrically connected to the organic light-emitting devices 300 arranged at a left side of the through portion H and a scan line electrically connected to the organic light-emitting devices 300 arranged at a right side of the through portion H may be connected to different scan drivers.

Referring to FIGS. 4 and 5 showing the through portion H in detail, at least one groove may be provided around the through portion H that penetrates through the substrate 100 and a plurality of layers INL and OL stacked on the substrate 100 in a vertical direction. In FIGS. 4 and 5, a first groove G1 and a second groove G2 surround the through portion H, but the present inventive concept is not limited thereto. In other words, one groove or three or more grooves may be provided. Hereinafter, an example in which two grooves G1 and G2 are provided around the through portion H will be described. The first groove G1 is closer to the through portion H than the second groove G2. As an example, when only one groove is provided around the through portion H, the second groove G2 may be the only groove provided.

The first groove G1 surrounds the through portion H and is spaced apart from the through portion H. The first groove G1 may have an undercut structure. For example, the first groove G1 may extend from the second barrier layer 104 to a part of the second base layer 103 of the substrate 100, on which the first base layer 101, the first barrier layer 102, the second base layer 103, and the second barrier layer 104 are sequentially stacked. The second barrier layer 104 may include a pair of first tips T1 facing each other and extending towards each other at an open upper end portion of the first groove G1.

The first groove G1 may be formed, for example, by patterning the second barrier layer 104 to form an opening and irradiating a laser or performing a dry etching to remove the second base layer 103 on the second barrier layer 104 by using the second barrier layer 104 as a mask. Accordingly, the second base layer 103 may be removed to have a width greater than the opening of the second barrier layer 104. Here, the width of the first groove G1 is a distance measured in a direction perpendicular to a lengthwise direction of the first groove G1. For example, when the first groove G1 has a circular loop shape, the width of the first groove G1 is a distance measured in a direction perpendicular to a circumferential direction of the circular loop.

In other words, in the first groove G1, the width at an upper end of the opening may be less than a width of an inner portion or a bottom of the first groove G1. In addition, the pair of first tips T1 of the second barrier layer 104 may have cantilever shapes facing each other at the upper end of the opening of the first groove G1.

In addition, since some of the plurality of layers included in the intermediate layer 320, e.g., functional layer(s), may be integrally provided throughout the plurality of organic light-emitting devices 300 (see FIG. 2) as described above, the functional layer(s) may be arranged in the non-display area PA2, as well as the display area DA. However, the intermediate layer 320 may not be arranged on an internal wall of the first groove G1 due to the undercut structure of the pair of first tips T1. Here, the intermediate layer 320 may be arranged only on a part of a bottom surface in the first groove G1. Therefore, the organic layers included in the intermediate layer 320 may be disconnected due to the first groove G1', and thus, infiltration of external moisture or oxygen introduced through the through portion H into the display area DA along the organic layers may be prevented.

The second groove G2 surrounds the first groove G1 on a region spaced apart from the first groove G1. The second groove G2 may have the same configuration as the first groove G1. In other words, at an upper end of an opening of the second groove G2, the second barrier layer 104 includes a pair of second tips T2 and the second groove G2 may have an undercut structure. Therefore, the organic layers included in the intermediate layer 320 may be disconnected due to the second groove G2.

The encapsulation layer 500 is located on an organic insulating layer OL. As described above, although the intermediate layer 320 is not arranged on the internal walls of the first groove G1 and the second groove G2 due to the undercut structures of the first groove G1 and the second groove G2, the first inorganic encapsulation layer 510 of the encapsulation layer 500 is conformally arranged on its underlying structure, and thus, the first inorganic encapsulation layer 510 may be arranged on lower surfaces of the first tip T1 and the second tip T2, as well as on the internal walls of the first groove G1 and the second groove G2. In other words, the first inorganic encapsulation layer 510 may be continuously arranged without being disconnected.

The organic encapsulation layer 520 may fill the second groove G2. Accordingly, stress concentrated on the second tip T2 having a structure in which inorganic layers such as the second barrier layer 104 and the first inorganic encapsulation layer 510 are stacked may be distributed, and damage to the second tip T2 may be prevented. Therefore, damage to the first inorganic encapsulation layer 510 and the second inorganic encapsulation layer 530 caused by the damage of the second tip T2 may be prevented. In addition, since the material for forming the organic encapsulation layer 520 is filled in the second groove G2, overflow of the material for forming the organic encapsulation layer 520 towards the first groove G1 may be prevented.

The second inorganic encapsulation layer 530 may be arranged similarly to the first inorganic encapsulation layer 510. For example, the second inorganic encapsulation layer 530 and the first inorganic encapsulation layer 510 are in contact with each other in the first groove G1 that is closest to the through portion H, and thus, infiltration of external moisture and oxygen may be effectively prevented.

In addition, the non-display area PA2 may be partitioned as first, second and third regions D1, D2, and D3 with respect to the first groove G1 and the second groove G2. The first region D1 is a space between the second groove G2 and the display area DA, in other words, a space from an end of the second tip T2 near the side of the display area DA to the display area DA. A part of the data line DL detouring around the through portion H may be arranged in the first region D1. The second region D2 is a space between the first groove G1 and the second groove G2, and from an end of the second tip T2 adjacent to the first groove G1 to an end of the first tip T1 adjacent to the second groove G2. The third region D3 is a region from an end of the first tip T1 adjacent to the through portion H to the through portion H, and functions as a region for ensuring a cutting margin when generating the through portion H.

As described above, an inorganic insulating layer INL such as the first inorganic insulating layer 120 and the second inorganic insulating layer 130 that may be located in the peripheral area PA (see FIG. 1), as well as in the display area DA, may also be located in the first region D1, the second region D2, and the third region D3. Here, an end portion of the inorganic insulating layer INL facing the through portion H in the first region D1 closest to the display area DA may be covered by the organic insulating layer OL. In other words, an end E2 of the organic insulating layer OL is closer to the second groove G2 than an end E1 of the inorganic insulating layer INL, and thus, the end portion of the inorganic insulating layer INL may not protrude out of the organic insulating layer OL. Therefore, a step caused by the inorganic insulating layer INL does not occur on an upper surface of the second tip T2, and consequently, the occurrence of defects such as crack in the first inorganic encapsulation layer 510 due to the step may be prevented.

The inorganic insulating layer INL may include at least one of the first inorganic insulating layer 120 and the second inorganic insulating layer 130, and the organic insulating layer OL may include at least one of the first organic insulating layer 140 and the second organic insulating layer 150. For example, since the end portion of the inorganic insulating layer INL including the first inorganic insulating layer 120 and the second inorganic insulating layer 130 is covered by the first organic insulating layer 140, a step coverage of the inorganic insulating layer INL may be increased to prevent damage to the first inorganic encapsulation layer 510 due to the step.

End portions of the inorganic insulating layer INL located in the second region D2 and the third region D3 are also covered by the organic insulating layer OL so that they do not protrude out of the organic insulating layer OL. Accordingly, damage to the first inorganic encapsulation layer 510 may be prevented. In addition, when the buffer layer is further located on the substrate 100, the buffer layer may have the same shape as that of the second barrier layer 104.

Figure 6:
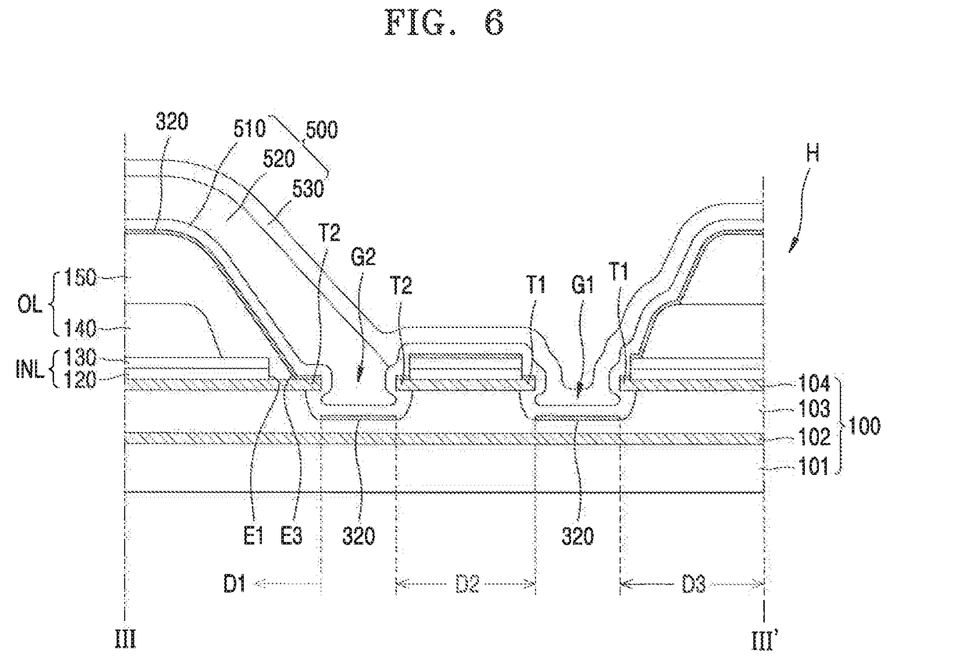
FIG. 6 is a cross-sectional view taken along line III-III' of FIG. 4, according to another exemplary embodiment of the present inventive concept.

FIG. 6 is a cross-sectional view taken along line III-III' of FIG. 4, according to another exemplary embodiment of the present inventive concept.

Referring to FIG. 6, the first groove G1 surrounds the through portion H at a location spaced apart from the through portion H, and the second groove G2 surrounds the first groove G1 at a location spaced apart from the first groove G1. The first groove G1 and the second groove G2 may be generated by partially removing the second barrier layer 104 and the second base layer 103 on the substrate 100, on which the first base layer 101, the first barrier layer 102, the second base layer 103, and the second barrier layer 104 are sequentially stacked.

In addition, the second barrier layer 104 includes a pair of first tips T1 facing each other and extending towards each other at an open upper end of the first groove G1. The second barrier layer 104 also includes a pair of second tips T2 facing each other and extending towards each other at an open upper end of the second groove G2. In other words, the first groove G1 and the second groove G2 may each have an undercut structure, and thus, the intermediate layer 320 may not be formed continuously to the through portion H, and infiltration of external moisture, etc. into the display area DA (see FIG. 1) through the organic layers (e.g., functional layers) included in the intermediate layer 320 may be prevented.

In addition, the end portion of the inorganic insulating layer INL including at least one of the first inorganic insulating layer 120 and the second inorganic insulating layer 130 in the first region D1 may be covered by the organic insulating layer OL. For example, the first organic insulating layer 140 and the second organic insulating layer 150 may be arranged on the inorganic insulating layer INL, and the end E1 of the inorganic insulating layer INL protruding out of the first organic insulating layer 140 may be covered by the second organic insulating layer 150. In other words, an end E3 of the second organic insulating layer 150 is closer to the second groove G2 than the end E1 of the inorganic insulating layer INL, and thus, the inorganic insulating layer INL may not protrude out of the second organic insulating layer 150.

Therefore, the step caused by the inorganic insulating layer INL does not occur on the upper surface of the second tip T2, and damage to the first inorganic encapsulation layer 510 of the encapsulation layer 500 arranged on the second organic insulating layer 150 in the first region D1 may be prevented. Since the organic encapsulation layer 520 and the second inorganic encapsulation layer 530 are described above, descriptions thereof are omitted.

In addition, the end portion of the inorganic insulating layer INL located in the second region D2 and the third region D3 may also be covered by the organic insulating layer OL so as not to protrude out of the organic insulating layer OL, and accordingly, damage to the first inorganic encapsulation layer 510 may be prevented. Here, the end portion of the inorganic insulating layer INL located in the second region D2 and the third region D3 may be covered by the first organic insulating layer 140 or by the second organic insulating layer 150.

Figure 7:
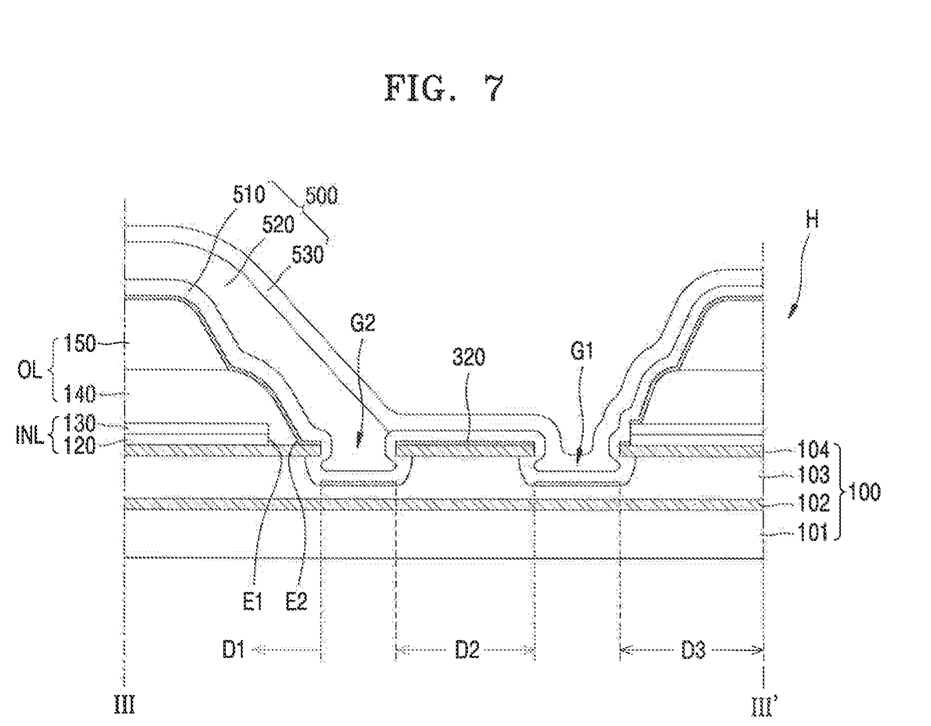
FIG. 7 is a cross-sectional view taken along line III-III' of FIG. 4, according to another exemplary embodiment of the present inventive concept.

FIG. 7 is a cross-sectional view taken along line III-III' of FIG. 4, according to another exemplary embodiment of the present inventive concept.

Referring to FIG. 7, the through portion H is surrounded by the first groove G1 and the second groove G2, and each of the first groove G1 and the second groove G2 may be formed by partially removing the second barrier layer 104 and the second base layer 103 of the substrate 100, on which the first base layer 101, the first barrier layer 102, the second base layer 103, and the second barrier layer 104 are sequentially stacked.

In addition, the end portion of the inorganic insulating layer INL including at least one of the first inorganic insulating layer 120 and the second inorganic insulating layer 130 in the first region D1 may be covered by the organic insulating layer OL. In other words, since the end E2 of the organic insulating layer OL is closer to the second groove G2 than the end E1 of the inorganic insulating layer INL, the end E1 of the inorganic insulating layer INL is prevented from protruding out of the organic insulating layer OL. Thus, a step caused by the inorganic insulating layer INL may not occur on an outer portion of the second groove G2. FIG. 7 shows that the end portion of the inorganic insulating layer INL is covered by the first organic insulating layer 140 like in FIG. 5; however, the end portion of the inorganic insulating layer INL may be covered by the second organic insulating layer 150 as shown in FIG. 6. In addition, the inorganic insulating layer INL located in the third region D3 may be also covered by the organic insulating layer OL like in the first region D1.

In the second region D2, the inorganic insulating layer INL may be removed. In other words, a functional layer included in the intermediate layer 320 on the second barrier layer 104 in the second region D2 may have the same area and the same shape as those of the second barrier layer 104. Therefore, a step due to the inorganic insulating layer INL does not occur in the second region D2, and thus, damage to the first inorganic encapsulation layer 510 of the encapsulation layer 500 due to the step may be prevented in the second region D2, as well as in the first region D1.

Figure 8:
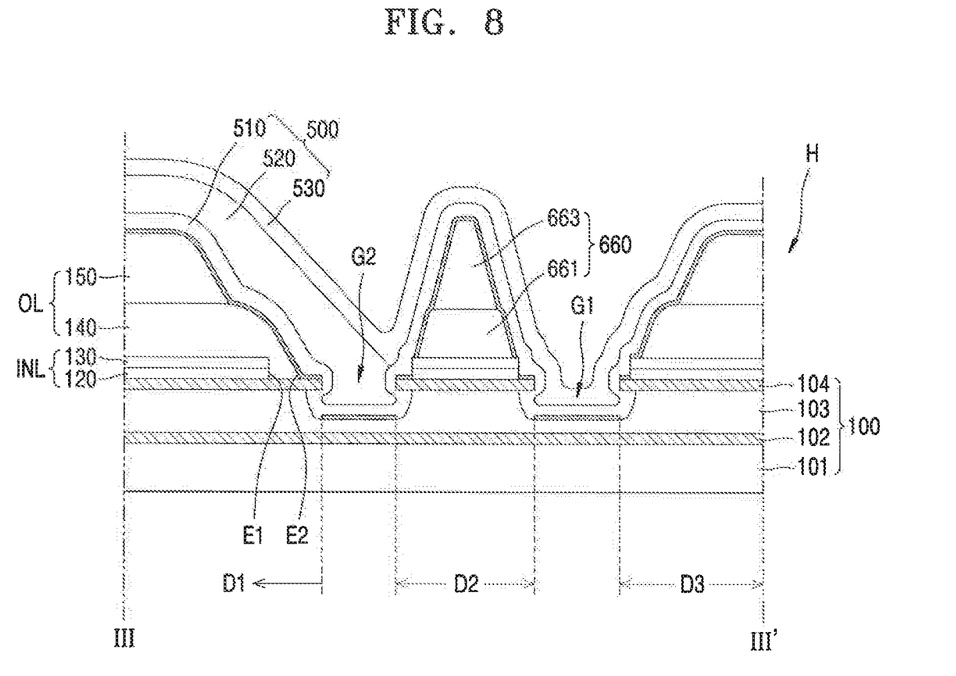
FIG. 8 is a cross-sectional view taken along line III-III' of FIG. 4, according to another exemplary embodiment of the present inventive concept.

FIG. 8 is a cross-sectional view taken along line III-III' of FIG. 4, according to another exemplary embodiment of the present inventive concept.

Referring to FIG. 8, the through portion H is surrounded by the first groove G1 and the second groove G2, and each of the first groove G1 and the second groove G2 may be formed by partially removing the second barrier layer 104 and the second base layer 103 of the substrate 100, on which the first base layer 101, the first barrier layer 102, the second base layer 103, and the second barrier layer 104 are sequentially stacked.

In addition, the end portion of the inorganic insulating layer INL including at least one of the first inorganic insulating layer 120 and the second inorganic insulating layer 130 in the first region D1 may be covered by the organic insulating layer OL. In other words, since the end E2 of the organic insulating layer OL is closer to the second groove G2 than the end E1 of the inorganic insulating layer INL, the end E1 of the inorganic insulating layer INL is prevented from protruding out of the organic insulating layer OL. Thus, a step caused by the inorganic insulating layer INL may not occur near the second groove G2. FIG. 8 shows that the end portion of the inorganic insulating layer INL is covered by the first organic insulating layer 140 like in FIG. 5; however, the end portion of the inorganic insulating layer INL may be covered by the second organic insulating layer 150 as shown in FIG. 6. In addition, the inorganic insulating layer INL located in the third region D3 may be also covered by the organic insulating layer OL like in the first region D1.

A blocking portion 660 may be located in the second region D2. The blocking portion 660 may block the material used to form the organic encapsulation layer 520 from overflowing to the first groove G1, when the organic encapsulation layer 520 is deposited. As an example, the blocking portion 660 may have a multi-layered structure. In other words, the blocking portion 660 may include a first layer 661 and a second layer 663 in a direction away from the substrate 100. The first layer 661 may be arranged simultaneously with the first organic insulating layer 140 by using the same material as that of the first organic insulating layer 140, and the second layer 663 may be arranged simultaneously with the second organic insulating layer 150 by using the same material as that of the second organic insulating layer 150. The blocking portion 660 may also have a single-layered structure. When the blocking portion 660 has the single-layered structure, the blocking portion 660 may only include the first layer 661 or the second layer 663.

According to exemplary embodiments of the present inventive concept, the display apparatus 10 includes the through portion H on which an additional member such as a camera, etc. is arranged and at least one groove (G1 or G2) surrounding the through portion H. Thus, infiltration of external moisture, etc. through the through portion H may be prevented while increasing the display area for displaying images.

In addition, since the end portion E1 of the inorganic layer INL of the display apparatus 10 is covered by the organic layer OL on a peripheral region of the groove (G1 or G2), the step caused by the inorganic layer INL may be coated and damage to the encapsulation layer 500 due to the step may be prevented.

While the present inventive concept has been described with reference to exemplary embodiments thereof, it will be understood by those of ordinary skill in the art that various changes in form and details may be made therein without departing from the spirit and scope of the present inventive concept as defined by the following claims.

What is claimed is:

1. A display apparatus comprising a display area and a peripheral area outside the display area, the display apparatus comprising:
    a substrate comprising a first base layer, a first barrier layer, a second base layer, and a second barrier layer that are sequentially stacked;
    an inorganic insulating layer stacked on the substrate and located in the display area and the peripheral area;
    an organic insulating layer on the inorganic insulating layer;
    a through portion located in the display area and penetrating through the substrate, the inorganic insulating layer, and the organic insulating layer;
    at least one groove surrounding the through portion, wherein an end portion of the inorganic insulating layer is covered by the organic insulating layer at an outer side of the at least one groove and the end portion faces the through portion; and
    an encapsulation layer covering an end of the organic insulating layer and extending into the at least one groove,
    wherein the encapsulation layer comprises a first inorganic encapsulation layer, a second inorganic encapsulation layer, and an organic encapsulation layer between the first inorganic encapsulation layer and the second inorganic encapsulation layer, the organic encapsulation layer filling the at least one groove, and
    wherein the second barrier layer comprises at least one tip protruding toward the at least one groove, and the at least one tip is not covered by the organic insulating layer.

2. The display apparatus of claim 1, wherein the at least one groove comprises a first groove surrounding the through portion and a second groove spaced apart from the first groove and surrounding the first groove,
    a first region is located between the display area and the second groove, a second region is located between the first groove and the second groove, and a third region is located between the first groove and the through portion, and
    in the first region, the end portion of the inorganic insulating layer is covered by the organic insulating layer.

3. The display apparatus of claim 2, further comprising a thin-film transistor and a display device, wherein the thin-film transistor is located on the substrate in the display area, and the display device is electrically connected to the thin-film transistor,
    wherein the organic insulating layer comprises at least one of a first organic insulating layer and a second organic insulating layer, wherein the first organic insulating layer covers the thin-film transistor, and the second organic insulating layer is on the first organic insulating layer.

4. The display apparatus of claim 3, wherein, in the first region, the end portion of the inorganic insulating layer protruding away from the first organic insulating layer is covered by the second organic insulating layer.

5. The display apparatus of claim 3, wherein the display device comprises an intermediate layer, a pixel electrode, and an opposite electrode, and
    the second organic insulating layer exposes at least a portion of the pixel electrode.

6. The display apparatus of claim 2, wherein the inorganic insulating layer is located in the first region and the third region, and is not located in the second region.

7. The display apparatus of claim 2, wherein a blocking portion including a material that is the same as a material included in the organic insulating layer is located in the second region.

8. The display apparatus of claim 7, wherein the organic encapsulation layer fills the second groove, and the first inorganic encapsulation layer and the second inorganic encapsulation layer contact each other in the first groove.

9. The display apparatus of claim 2, wherein the first groove and the second groove each extend from the second barrier layer to a portion of the second base layer, and
the at least one tip comprises a pair of first tips and a pair of second tips, the pair of first tips facing each other and extending towards each other at an open upper portion of the first groove, and the pair of second tips facing each other and extending towards each other at an open upper portion of the second groove.

10. The display apparatus of claim 1, further comprising a thin-film transistor located on the substrate in the display area and comprising a semiconductor layer, a gate electrode, a source electrode, and a drain electrode,
wherein the inorganic insulating layer comprises at least one of a first inorganic insulating layer located between the semiconductor layer and the gate electrode and a second inorganic insulating layer located between the gate electrode and the source and drain electrodes.

11. A display apparatus comprising a display area and a peripheral area outside the display area, the display apparatus comprising:
a substrate comprising a first base layer, a first barrier layer, a second base layer, and a second barrier layer that are sequentially stacked;
a thin-film transistor and a display device, the thin-film transistor being located on the substrate in the display area, and the display device being electrically connected to the thin-film transistor;
at least one through portion located in the display area and vertically penetrating through the substrate and a plurality of layers stacked on the substrate; and
at least one groove surrounding the at least one through portion,
wherein the thin-film transistor comprises a semiconductor layer, a gate electrode, a source electrode, and a drain electrode, the plurality of layers comprise a first inorganic insulating layer between the semiconductor layer and the gate electrode, a second inorganic insulating layer between the gate electrode and the source and drain electrodes, and an organic insulating layer on the thin-film transistor,
end portions of the first inorganic insulating layer and the second inorganic insulating layer are covered by the organic insulating layer, the end portions of the first inorganic insulating layer and the second inorganic insulating layer facing the at least one through portion at an outer side of the at least one groove, and
the second barrier layer comprises at least one tip protruding toward the at least one groove, and the at least one tip is not covered by the organic insulating layer.

12. The display apparatus of claim 11, wherein the at least one groove comprises a first groove and a second groove that are spaced apart from each other, a first region is located between the display area and the second groove, a second region is located between the first groove and the second groove, and a third region is located between the first groove and the at least one through portion, and
in the first region, an end portion of the organic insulating layer is closer to the second groove than the end portions of the first inorganic insulating layer and the second inorganic insulating layer facing the at least one through portion.

13. The display apparatus of claim 12, wherein the first groove and the second groove each extend from the second barrier layer to a portion of the second base layer, and
a width of an open upper portion of the first groove is less than a width of an inner portion of the first groove, and
a width of an open upper portion of the second groove is less than a width of an inner portion of the second groove.

14. The display apparatus of claim 13, wherein the at least one tip comprises a pair of first tips and a pair of second tips, the pair first tips having cantilever shapes facing each other at the open upper portion of the first groove, and the pair of second tips having cantilever shapes facing each other at the open upper portion of the second groove.

15. The display apparatus of claim 13, further comprising an encapsulation layer on the organic insulating layer, the encapsulation layer comprising a first inorganic encapsulation layer, a second inorganic encapsulation layer, and an organic encapsulation layer between the first inorganic encapsulation layer and the second inorganic encapsulation layer,
wherein the organic encapsulation layer fills the second groove, and
the first inorganic encapsulation layer and the second inorganic encapsulation layer contact each other in the first groove.

16. The display apparatus of claim 12, wherein the display device comprises an intermediate layer, a pixel electrode, and an opposite electrode, and
the organic insulating layer comprises a first organic insulating layer and a second organic insulating layer, the first organic insulating layer covering the thin-film transistor, and the second organic insulating layer located on the first organic insulating layer and exposing at least a portion of the pixel electrode.

17. The display apparatus of claim 16, wherein, in the first region, the end portions of the first inorganic insulating layer and the second inorganic insulating layer are covered by the first organic insulating layer.

18. The display apparatus of claim 16, wherein, in the first region, the end portions of the first inorganic insulating layer and the second inorganic insulating layer protrude away from the first organic insulating layer, and the end portions of the first inorganic insulating layer and the second inorganic insulating layer protruding away from the first organic insulating layer are covered by the second organic insulating layer.

19. The display apparatus of claim 16, wherein a blocking portion is located in the second region, and
the blocking portion comprises at least one of a first layer and a second layer, wherein the first layer includes a material that is the same as a material of the first organic insulating layer, and the second layer includes a material that is the same as a material of the second organic insulating layer.

20. The display apparatus of claim 12, wherein the first inorganic insulating layer, the second inorganic insulating layer, and the organic insulating layer are located in the first region and the third region, and are not located in the second region.

* * * * *